(12) United States Patent
Pan et al.

(10) Patent No.: US 7,460,431 B1
(45) Date of Patent: Dec. 2, 2008

(54) IMPLEMENTATION OF DOUBLE DATA RATE EMBEDDED MEMORY IN PROGRAMMABLE DEVICES

(75) Inventors: Philip Pan, Fremont, CA (US); Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 193 days.

(21) Appl. No.: 11/242,693

(22) Filed: Oct. 3, 2005

(51) Int. Cl.
 *G11C 8/00* (2006.01)
(52) U.S. Cl. .............................. 365/233.13; 365/230.05; 365/233.1
(58) Field of Classification Search ............ 365/189.05, 365/191, 198, 230.05, 233.1, 233.11, 233.13
See application file for complete search history.

(56) References Cited

U.S. PATENT DOCUMENTS

| | | | | |
|---|---|---|---|---|
| 6,094,375 | A * | 7/2000 | Lee | ........................ 365/189.04 |
| 6,125,078 | A * | 9/2000 | Ooishi et al. | ................. 365/233 |
| 6,151,271 | A * | 11/2000 | Lee | ........................ 365/230.03 |
| 6,516,363 | B1 * | 2/2003 | Porter et al. | ................... 710/60 |
| 6,686,769 | B1 * | 2/2004 | Nguyen et al. | ................. 326/46 |
| 6,795,360 | B2 * | 9/2004 | Duh et al. | .................... 365/221 |
| 7,091,890 | B1 * | 8/2006 | Sasaki et al. | ................. 341/100 |

* cited by examiner

*Primary Examiner*—Anh Phung
*Assistant Examiner*—Alexander Sofocleous
(74) *Attorney, Agent, or Firm*—Townsend and Townsend and Crew LLP

(57) ABSTRACT

A memory block of a programmable device uses a double data rate communication scheme to communicate data with logic cells at a rate of two bits per clock cycle per data line. The memory block can be configured to use the double data rate communication scheme or a single data rate communication scheme. The memory block can switch between either communications scheme as needed to communicate with different portions of the programmable device. If a memory block of a programmable device includes two or more data access ports, an embodiment of a programmable device allows each data access port to be configured for single data rate or double data rate communications independently of other data ports. Any arbitrary logic cell of the programmable device can communicate with a memory block using the double data rate communication scheme by configuring additional logic cells to operate as a double data rate interface.

19 Claims, 8 Drawing Sheets

IMPLEMENTATION OF DOUBLE DATA RATE EMBEDDED MEMORY IN PROGRAMMABLE DEVICES

BACKGROUND OF THE INVENTION

The present invention relates to the field of programmable devices. Programmable devices, such as FPGAs, typically includes thousands of programmable logic cells that use combinations of logic gates and/or look-up tables to perform logic operations. Programmable devices also include a number of functional blocks having specialized logic devices adapted to specific logic operations, such as adders, multiply and accumulate circuits, phase-locked loops, and one or more memory units for storage and retrieval of data used by the logic cells. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

The configuration of the logic cells, functional blocks, switching circuit, and other components of the programmable device is referred to as configuration data. Configuration data can be stored in volatile or non-volatile memory on the programmable device. Additionally, configuration data can be provided and temporarily or permanently loaded into the programmable device during its manufacturing. Users specify a user design that performs a desired information processing function. Compilation software tools analyze the user design and generate corresponding configuration data that implements the desired information processing function using a programmable device. The user-created configuration data can be temporarily or permenently loaded into one or more programmable devices to implement the user design. If the user design is changed, updated configuration data can be loaded into the programmable device to implement the changed user design.

Traditionally, memory blocks within a programmable device can exchange data with the logic cells at a rate of one bit per data line per clock cycle. For example, if the memory block is connected with logic cells via eight data lines (i.e. an eight bit data bus), then data is communicated at a rate of up to eight bits per clock cycle. This data communication scheme is commonly referred to as single data rate (SDR) communication.

There are several techniques for increasing the data communication rates between memory blocks and logic cells in programmable devices. The user can optimize the user design to allow for a higher clock frequency of the programmable device when implementing the user design. However, this is difficult or impossible for some user designs. Moreover, although this increases the rate at which data is communicated between logic cells and memory blocks, it also increases the rate at which logic cells can process data. Thus, increasing the clock frequency does not remedy situations in which logic cells can process data faster than it can be stored or retrieved from a memory block.

In some programmable devices, user designs can specify the width of the data bus between memory blocks and logic cells. For these types of programmable device, the data communication rate between a memory block and logic cells can be increased by increasing the width of data bus. This allows more bits of data to be stored or retrieved in parallel per clock cycle. However, the configurable switching circuit of the programmable device typically has a limited number of high speed connections and a larger number of slower connections. Increasing the width of the data bus requires the allocation of additional connections in the configurable switching circuit, often taking away high speed connections from other portions of the user design. In many cases, this increases signal delays on timing critical signal paths, which results in a decrease in the maximum operating speed of the user design.

It is therefore desirable for a programmable device to include memory blocks that provide improved data communication rates with logic cells. It is further desirable for memory blocks in a programmable device to provide improved data communication rates with logic cells without taking addition connection resources from the configurable switching circuit. It is further desirable for a programmable device to include two or more memory blocks operating at different data communication rates as needed. It is also desirable for a memory block to allow for different data communication rates at different times or on different memory ports as required. It is additionally desirable for a programmable device to enable any of its logic cells to communicate with memory blocks at an improved data rate as needed.

BRIEF SUMMARY OF THE INVENTION

In an embodiment, a memory block of a programmable device uses a double data rate communication scheme to communicate data with logic cells at a rate of two bits per clock cycle per data line. In a further embodiment, the memory block can be configured to use the double data rate communication scheme or a single data rate communication scheme. In an embodiment, the memory block can switch between either communications scheme as needed to communicate with different portions of the programmable device. If a memory block of a programmable device includes two or more data access ports, an embodiment of a programmable device allows each data access port to be configured for single data rate or double data rate communications independently of other data ports. In a further embodiment, the programmable device includes multiple blocks, each of which can be configured for double data rate communications independently of other memory blocks. In additional embodiments, any arbitrary logic cell of the programmable device can communicate with a memory block using the double data rate communication scheme.

In an embodiment, a memory block in a device includes a memory array adapted to store data and a data output circuit having first and second modes. The data output circuit includes first and second data registers and a data output line. The data output circuit is adapted to read a bit from the memory array at a first clock rate and to communicate the bit with another portion of the device at the first clock rate via the data output line in the first mode. The data output circuit is adapted to read first and second bits in parallel from the memory array at the first clock rate and to communicate the first and second bits with another portion of the device at twice the first clock rate via the data output line in the second mode.

In another embodiment, the data output circuit is responsive to a mode selection input adapted to receive a mode selection signal from at least one portion of the device, wherein the mode selection signal specifies the first or second mode of the data output circuit of the memory block. The mode selection input may be adapted to receive the mode selection signal from configuration data stored in a configuration memory of the device.

In another embodiment, the mode selection input is adapted to receive a first mode selection signal from a first portion of the device adapted to receive data from the memory block at twice the first clock rate via the data output line. The data output line may be adapted to connect with the first portion of the device and a second portion of the device via a shared data bus. The second portion of the device is adapted to receive data from the memory block at the first clock rate via the shared data bus and the data output line. The mode selection input is adapted to receive a second mode selection signal from second portion of the device in conjunction with the second portion of the device using the shared data bus and to receive the first mode selection signal from the first portion of the device in conjunction with the first portion of the device using the shared data bus.

An embodiment of the memory block includes a data input circuit having first and second modes. The data input circuit including a data input line, which is adapted to receive a bit from another portion of the device via the data input line at a first clock rate and to store the bit in the memory array in the first mode. The data input circuit is adapted to receive first and second bits in series from another portion of the device via the data input line at twice the first clock rate and to store the first and second bits in the memory array in the second mode.

In an embodiment, the data input circuit is responsive to a mode selection input adapted to receive a mode selection signal from at least one portion of the device. The mode selection signal specifies the first or second mode of the data input circuit of the memory block. In an embodiment, the mode selection input is adapted to receive the mode selection signal from configuration data stored in a configuration memory of the device. In another embodiment, the mode selection input is adapted to receive a first mode selection signal from a first portion of the device adapted to communicate data with the memory block at twice the first clock rate via the data input line.

BRIEF DESCRIPTION OF THE DRAWINGS

The invention will be described with reference to the drawings, in which.

DETAILED DESCRIPTION OF THE INVENTION

Figure 1A:
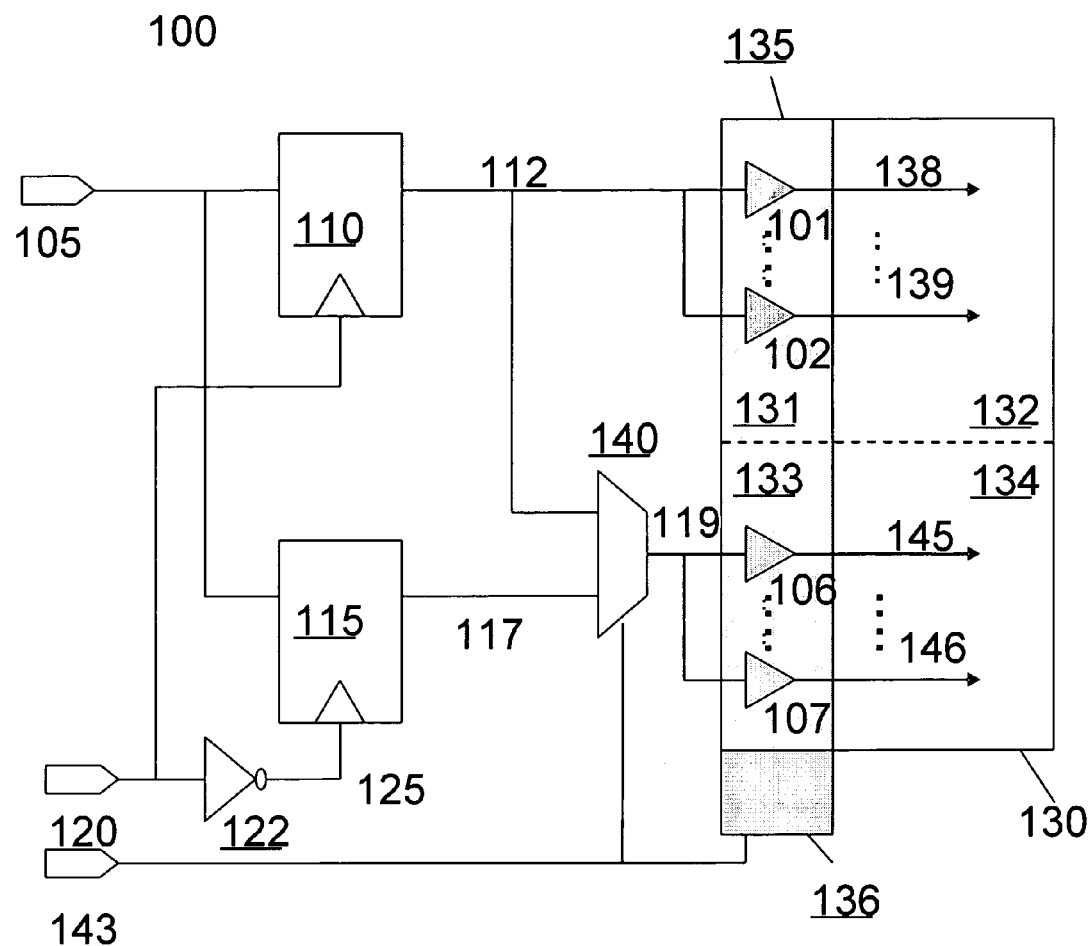
FIGS. 1A-1B illustrate data input and output circuits of a memory block in a programmable device according to an embodiment of the invention.
Figure 1B:
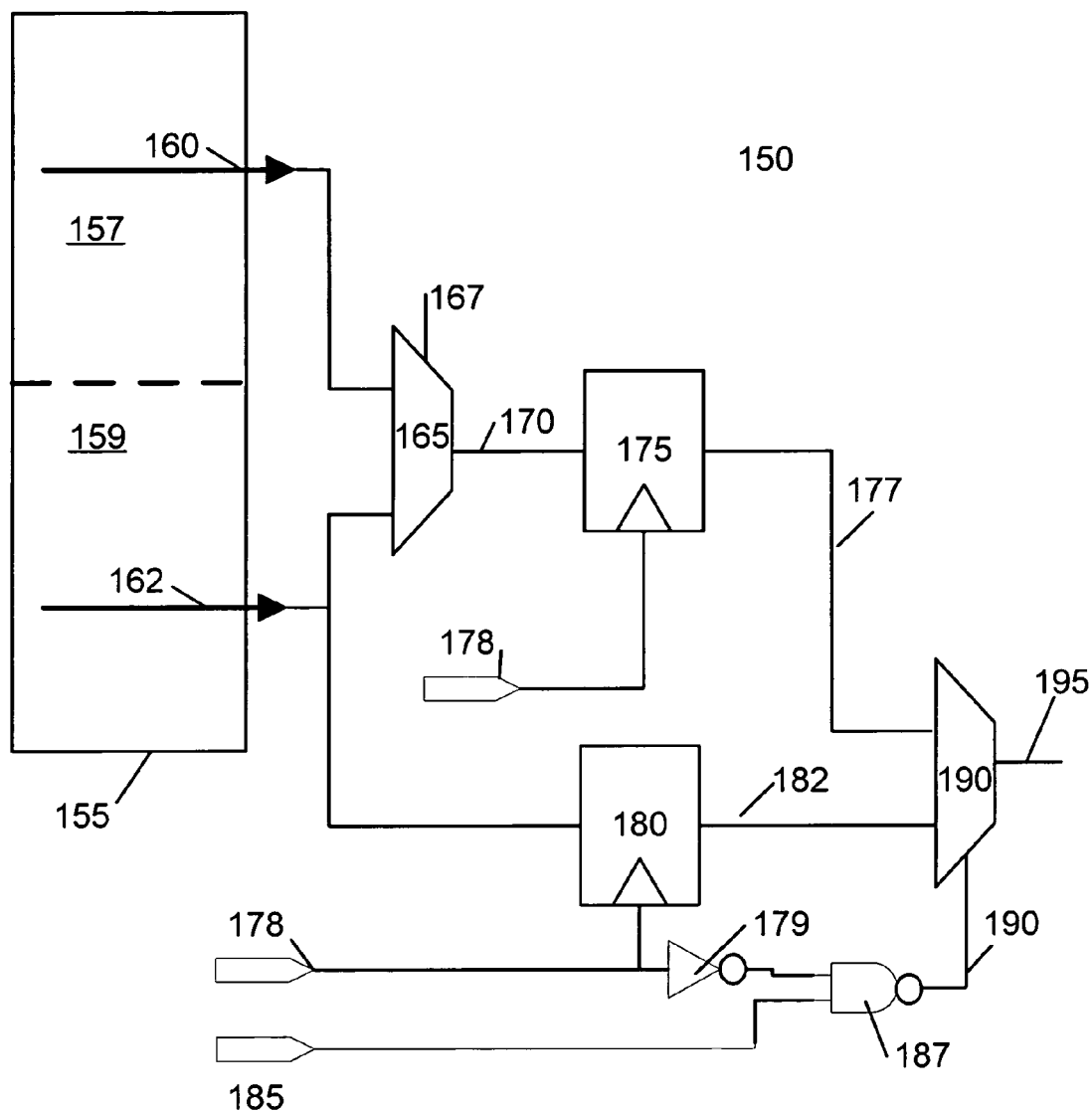

FIGS. 1A-1B illustrate data input and output circuits of a memory block in a programmable device according to an embodiment of the invention. The data input and output circuits enable a memory block to communicate with logic cells and other components of the programmable device using double data rate or single data rate communications schemes. FIG. 1A illustrates a data input circuit 100 of a memory block according to an embodiment of the invention. Data input circuit 100 includes a data input 105 for receiving data from other portions of the programmable device, such as logic cells, I/O blocks, or other functional blocks, via either single or double data rate communications schemes. Data input 105 is connected with data registers 110 and 115. Data register 110 is controlled by a clock signal received via a clock input 120. In an embodiment, the clock input 120 is connected with the global clock signal used to control the programmable device. In response to the clock signal, an embodiment of data register 110 stores the value of the data signal received by data input 105 in the first half of each clock cycle.

Clock input 120 is also connected with inverter 122. In response to the clock signal, the output 125 of the inverter 122 is an inverted clock signal. The inverted clock signal is approximately 180 degrees out of phase with the clock signal received by clock input 120. The output 125 of the inverter 122 is connected with the clock input of the data register 115. In response to the inverted clock signal, an embodiment of data register 115 stores the value of the data signal received by data input 105 in the second half of each clock cycle.

In cases where the data signal is using a double data rate communications scheme, the values stored by data registers 110 and 115 in a clock cycle will represent different bits of data. In cases where the data signal is using a single data rate communications scheme, the values stored by data registers 110 and 115 in a clock cycle will represent the same bit of data. As discussed in detail below, an embodiment of the data input circuit 100 includes a control signal input used to specify whether incoming data signals are to be interpreted as single data rate or double data rate communications.

In an embodiment, the output 112 of data register 110 is connected with a demultiplexer 135. Demultiplexer 135 selectively connects the output 112 of the data register 110 with either the bit line N input 138 or with input 139 of multiplexer 140. As discussed in detail below, the value of the data signal on output 112 may be passed through multiplexer 140 to bit line N+X input 145 when the data input circuit 100 memory block is being operated using a single data rate communications scheme.

Bit line N input 138 represents an input to an arbitrary bit line (N) in memory array 130. In an embodiment, the value of N, and hence the specific bit line connected with demultiplexer 135, is specified by all or a portion of a memory address. The memory address can be provided to the memory block by other portions of the programmable device or generated internally. The circuits for storing and decoding the memory address and connecting the output of demultiplexer 135 to the appropriate bit line are well known to those of ordinary skill in the art and are omitted for clarity.

Bit line N+X input 145 represents an input to an arbitrary bit line (N+X) in memory array 130. In an embodiment, the value of N+X, and hence the specific bit line connected with the output of multiplexer 140, is specified by all or a portion of a memory address. The memory address can be provided to the memory block by other portions of the programmable device or generated internally. The circuits for storing and decoding the memory address and connecting the output of multiplexer 140 to the appropriate bit line are well known to those of ordinary skill in the art and are omitted for clarity.

The demultiplexer 135 is controlled with input 137. In an embodiment, input 137 is connected with one of the bits of the memory address used to specify the storage location of data received by the data input circuit 100. Embodiments of data input circuit 100 can use any arbitrary bit of the memory address to control demultiplexer 135.

For example, the most significant bit (MSB) of all or a portion of the memory address can be connected with input 137 to control demultiplexer 135. This example essentially partitions the memory array 130 into two portions, 132 and 134. In an example, when the data input circuit is operating using a single data rate communications scheme, a low or 0 value of the MSB of at least a portion of the memory address directs the data stored by data register 110 to bit line N input 138 in portion 132 of memory array 130. Conversely, a high or 1 value of the MSB of at least a portion of the memory address directs the data stored by data register 110 to bit line N+X input 145 in portion 134 of memory array 130. In this example, the value of X is specified by the place value of the MSB of the memory address and the value of N is specified by the remaining portion of the memory address. In other examples, any other bit of a memory address can be used to control demultiplexer 135. For example, the least significant bit of at least a portion of the memory address can be connected with input 137 to partition the memory array 130 into portions corresponding to the odd and even bit lines.

As discussed above, the output 139 of the demultiplexer 135 is connected with the input of multiplexer 140. Multiplexer 140 is controlled by data rate selection input 143. Data rate selection input enables the programmable device to specify whether the data input circuit 100 is to interpret a data signal as single data rate or double data rate communication. When the signal provided to data rate selection input 143 indicates single data rate communication is being used, the multiplexer 140 connects output 139 with bit line N+X input 145.

Thus, the value of the data signal received by data input 105 in the first half of a clock cycle and stored in data register 110 is passed to bit line N+X input 145 if called for by the value of the memory address bit connected with control input 137 and if the single data rate communication is being used. Alternatively, the memory address bit connected with control input 137 may direct the data from data register 110 to bit line N input 138.

Conversely, if the signal provided to data rate selection input 143 indicates double data rate communication is being used, the multiplexer 140 connects output 117 of the data register 115 with bit line N+X input 145. Thus, the value of the data signal received by data input 105 in the second half of each clock cycle is provided to bit line N+X input 145.

In a further embodiment, when data input circuit 100 is operating using a double data rate communication scheme, data register 110 is only connected with bitlines in portion 132 of the memory array 130 and data register 115 is only connected with bitlines in portion 134 of the memory array 130. In this embodiment, the range of possible memory addresses is reduced in half and the value of signal on control input 137 always connects the output 112 of data register 110 with bit line N input 138. In this embodiment, data from data registers 110 and 115 can be written in parallel to bit line N input 138 and bit line N+X input 145, respectively, where X is a constant based upon the partitioning of the memory array and N is based on the value of the memory address.

In an embodiment, the data rate selection input 143 is connected with a signal from the configuration memory of the programmable device. In this embodiment, the programmable device configuration data specifies whether the data input circuit 100 should operate in single data rate or double data rate communication mode. The programmable device configuration typically remains constant while the programmable device is implementing a user design; thus this embodiment typically sets the data input circuit 100 to use the same data rate communication scheme during the operation of the programmable device with a given configuration.

In another embodiment, the data rate selection input 143 is connected with a signal from a logic cell or other portion of the programmable device. In this embodiment, the data input circuit 100 can switch between single data rate and double data rate communications as needed. For example, some portions of the programmable device may be adapted to communicate with the memory block using double data rate communications and other portions of the programmable device may be adapted to communicate with the memory block using single data rate communications. In this example, control logic implemented by portions of the programmable device, such as additional logic cells, can be used to provide the appropriate value to the data rate selection input 143 of the data input circuit 100 depending upon the portion of the programmable device interacting with the memory block.

Memory array 130 can be any type of electronic memory device known to those of ordinary skill in the art, including static and dynamic random access memory; and non-volatile memory. Additionally, as shown in the FIG. 1A, the data input circuit 100 is adapted to receive a data signal via a 1-bit data bus. In further embodiments, all or portions of the data input circuit 100 may be duplicated to implement memory interfaces with larger bus widths. The width of the data bus connected with the data input circuit 100 can be of a fixed width, or in further embodiments, integrated with a variable width data bus interface of the memory block. In these further embodiments, both the width and data rate communication scheme can be specified by the configuration and/or operation of a user design.

FIG. 1B illustrates a data output circuit 150 according to an embodiment of the invention. Data is retrieved from memory array 155 via sense amplifier N output 160 and sense amplifier N+X output 162. Memory array 155 is similar to memory array 130 discussed above. Additionally, memory array 155 includes circuits for retrieving data, such as sense amplifiers, address decoders, and bit line drivers, that are well known to one of ordinary skill in the art and are omitted from FIG. 1B for clarity. In an embodiment, the memory array is adapted to retrieve two or more bits of data in parallel via sense amplifier N output 160 and sense amplifier N+X output 162.

Sense amplifier N output 160 represents the output of a sense amplifier or other circuit adapted to retrieve data from the memory array 155 via an arbitrary bit line (N). In an embodiment, the value of N, and hence the specific bit line, is specified by all or a portion of a memory address. The memory address can be provided to the memory block by other portions of the programmable device or generated internally. The circuits for storing and decoding the memory address and retrieving data from the corresponding location in memory array 155 are well known to those of ordinary skill in the art and are omitted for clarity. Similarly, sense amplifier N+X output 162 represents an output of a sense amplifier or other circuit adapted to retrieve data from the memory array 155 via an arbitrary bit line (N+X).

Sense amplifier N+X output 162 is connected with data register 180. Data register 180 is controlled by a clock signal received via clock input 178. In an embodiment, the clock input 178 is connected with the global clock signal used to control the programmable device. In response to the clock signal, an embodiment of data register 180 stores the value of the data retrieved from sense amplifier N+X output 162.

Sense amplifier N and N+X outputs 160 and 162 are connected with multiplexer 165. Multiplexer 165 selectively connects either sense amplifier N output 160 or sense amplifier N+X output 162 with the multiplexer output 170. The multiplexer 165 is controlled with input 167. In an embodiment, input 167 is connected with one of the bits of the memory address used to specify the storage location of data to be retrieved from the memory array 155. Embodiments of data input circuit 150 can use any arbitrary bit of the memory address to control multiplexer 165.

For example, the most significant bit (MSB) of all or a portion of the memory address can be connected with input 167 to control demultiplexer 165. This example essentially partitions the memory array 155 into two portions, 157 and 159. In an example, when the data input circuit is operating using a single data rate communications scheme, a low or 0 value of the MSB of at least a portion of the memory address directs the data retrieved by the sense amplifier N output 160 from portion 157 of the memory array 155 to multiplexer output 170. Conversely, a high or 1 value of the MSB of at least a portion of the memory address directs the data retrieved by the sense amplifier N+X output 162 from portion 159 of the memory array 155 to multiplexer output 170. In this example, the value of X is specified by the place value of the MSB of the memory address and the value of N is specified by the remaining portion of the memory address. In other examples, any other bit of a memory address can be used to control multiplexer 165. For example, the least significant bit of at least a portion of the memory address can be connected with input 167 to partition the memory array 155 into portions corresponding to the odd and even bit lines.

Data register 175 is connected with multiplexer output 170. Data register 175 is controlled by a clock signal received by clock input 178. In response to a clock signal, the data register 170 stores the data value received from the multiplexer output 170. When operating using a single data rate communication scheme, an embodiment of data register 175 of data output circuit 150 receives data retrieved via either the sense amplifier N output 160 or sense amplifier N+X output 162, depending upon the value of the address bit used to control multiplexer 165.

When operating using a double data rate communications scheme, an embodiment of data register 170 receives and stores data retrieved via sense amplifier N output 160. In this embodiment, the address bit or other control signal provided to control input 167 of multiplexer 165 is adapted so that sense amplifier N output 160 is connected to multiplexer output 170 during double data rate communications. In parallel with the operation of data register 175, an embodiment of data register 180 receives and stores data retrieved via sense amplifier N+X output 162.

The outputs 177 and 182 of data registers 175 and 180, respectively, are connected with multiplexer 190. Multiplexer 190 selectively connects either output 177 or 182 with data output port 195. Multiplexer 190 is controlled by a combination of a clock signal received from clock input 178 and a data rate selection signal received via a data rate selection input 185. The clock input 178 is connected with an inverter gate 179, which inverts the clock signal and outputs a clock signal phase-shifted approximately 180 degrees. The inverted clock signal from inverter gate 179 and the signal from data rate selection input 185 are connected with NAND logic gate 187.

The multiplexer 190 and logic gates 179 and 187 are configured to operate as follows. During single data rate communication schemes, the signal received by the data rate selection input 185 ensures that the multiplexer connects only the output 177 of register 175 with the data output port 195. During double data rate communication schemes, the inverted clock signal causes the multiplexer 190 to connect the output 177 of register 175 with data output port 195 for one half of a clock cycle and to connect the output 182 of register 180 with the data output port 195 for the other half of a clock cycle. As a result, the data output port 195 can communicate two bits of data during a single clock cycle.

In an embodiment, the data rate selection input 185 is connected with a signal from the configuration memory of the programmable device. In this embodiment, the programmable device configuration data specifies whether the data output circuit 150 should operate in single data rate or double data rate communication mode. The programmable device configuration typically remains constant while the programmable device is implementing a user design; thus this embodiment typically sets the data output circuit 150 to use the same data rate communication scheme during the operation of the programmable device with a given configuration.

In another embodiment, the data rate selection input 185 is connected with a signal from a logic cell or other portion of the programmable device. In this embodiment, the data output circuit 150 can switch between single data rate and double data rate communications as needed. For example, some portions of the programmable device may be adapted to communicate with the memory block using double data rate communications and other portions of the programmable device may be adapted to communicate with the memory block using single data rate communications. In this example, control logic implemented by portions of the programmable device, such as additional logic cells, can be used to provide the appropriate value to the data rate selection input 185 of the data output circuit 150 depending upon the portion of the programmable device interacting with the memory block.

Figure 2A:
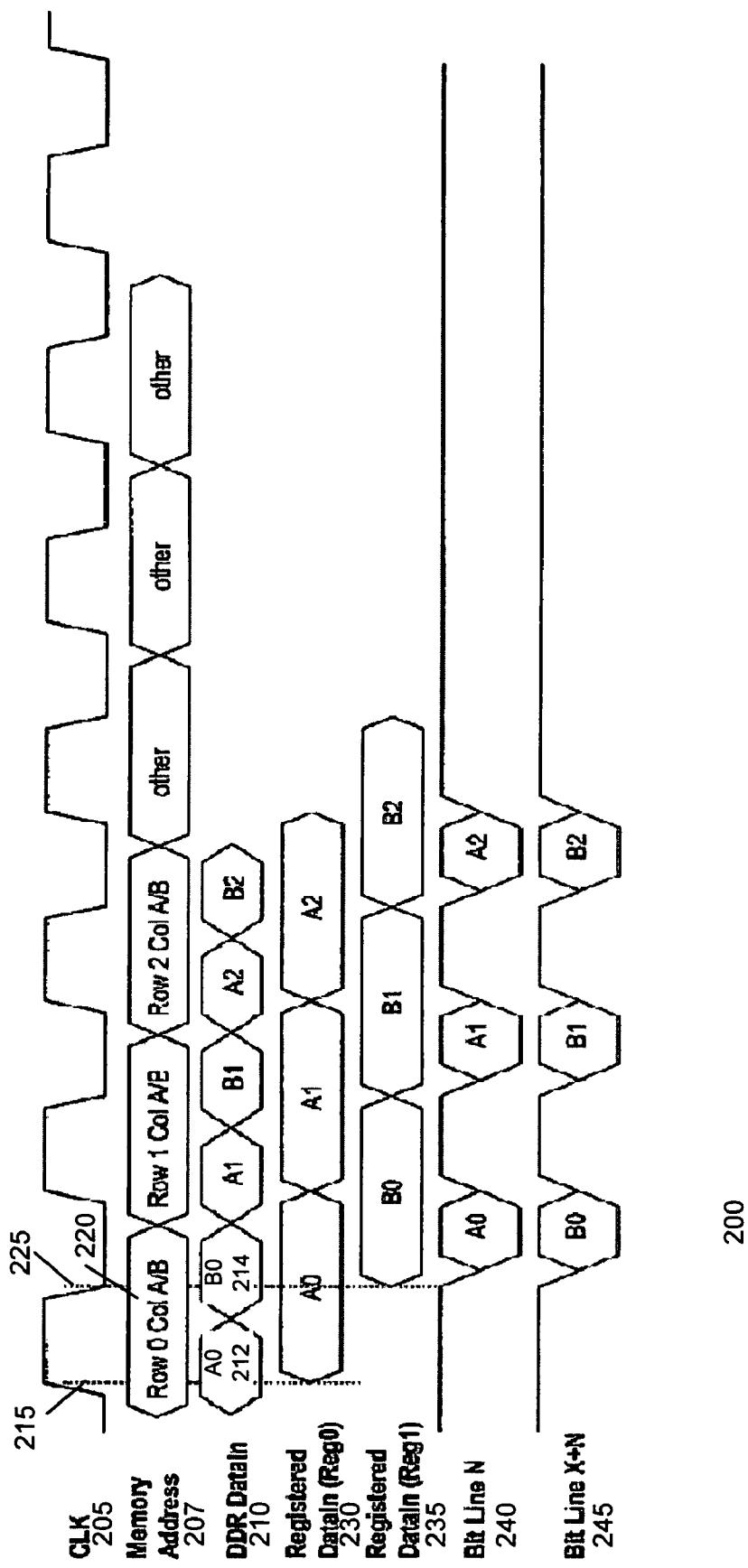
FIGS. 2A-2B illustrate example timing diagrams for data input and data output of a memory block in a programmable device according to an embodiment of the invention.
Figure 2B:
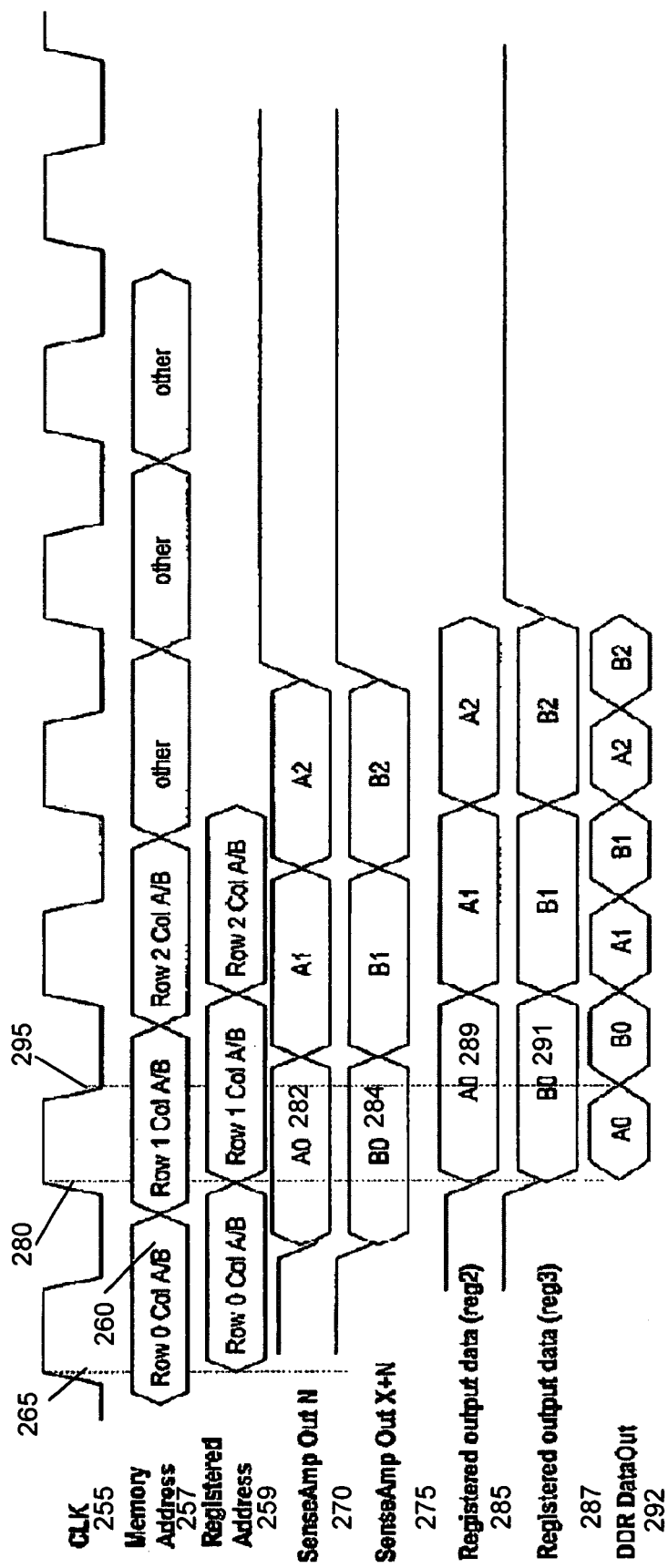

FIGS. 2A-2B illustrate example timing diagrams for data input and data output of a memory block in a programmable device according to an embodiment of the invention. FIG. 2A illustrates a timing diagram 200 for a data write operation to a memory block using a double data rate communications scheme according to an embodiment of the invention. The memory block receives a clock signal 205, memory address signals 207, and one or more data input signals 210. As discussed above, the data input signal 210 communicates two bits of data per clock cycle per data input line when operating using a double data rate communications scheme. The memory block may receive data via two or more data signals communicated via a corresponding number of data lines. When using a double data rate communication scheme, the total number of bits received per clock cycle will be twice the number of data signals received.

In an example data write operation to the memory block, at the time of transition 215 of the clock signal 205, a first data register of the data input circuit stores the data value of the data input signal 210. In this case, the data input signal 210 has the value A0 212 at the time of transition 215. This value is reflected by the first data register signal 230 in timing diagram 200. Similarly, at the time of transition 225 of the clock signal 205, a second data register of the data input circuit stores the data value of the data signal 210, which has the value B0 214 at the time of transition 225. This value is reflected by the second data register signal 235 in timing diagram 200.

In parallel with receiving and storing data values received from the data input signal 210, the memory block decodes a memory address 220 from the memory address signals 207. The decoded memory address 200 specifies the memory locations to store the data values provided by data input signal 210. In an embodiment, the decoded memory address 200 specifies one row of the memory array and two bit lines. In an embodiment, a first bit line is specified directly by the decoded memory address 200 and the second bit line is offset from the first bit line by a constant. For example, if the decoded memory address 200 specifies bit line N, the second bit line may be specified as bit line X+N.

At the time of clock transition 225, the data values stored in the first and second data registers are transferred to the first and second bit lines, respectively, for storage. At the time of clock transition 225, the value of the first data register signal 230 is transferred to the first bit line signal 240. Similarly, at the time of clock transition 225, the value of the second data register signal 235 is transferred to the second bit line signal 245. The memory array then stores the values of the bit line signals 240 and 245 in the memory locations specified by the memory address 220.

FIG. 2B illustrates a timing diagram 250 for a data read operation from a memory block using a double data rate communications scheme according to an embodiment of the invention. The memory block receives a clock signal 255 and memory address signals 257. In an example data read operation from the memory block, at the time of transition 265 of clock signal 255, the value 260 of the memory address signal 257 is latched into a memory address register of the memory block. The value of the memory address register is shown by signal 259.

The memory block decodes the memory address stored in the memory address register and initiates a memory read operation from two memory locations in the memory array. In embodiments in which the memory block has two or more data output lines, the memory read operation will retrieve two bits of data from two memory locations respectively for each data output line.

In an embodiment, the decoded memory address specifies one row of the memory array and two bit lines. In an embodiment, a first bit line is specified directly by the decoded memory address 200 and the second bit line is offset from the first bit line by a constant. For example, if the decoded memory address 200 specifies bit line N, the second bit line may be specified as bit line X+N. In an embodiment, each specified bit line is connected with a sense amplifier to detect the value of data stored in a memory location given by the specified row and bit line.

The memory array outputs the retrieved data values on sense amplifier outputs 270 and 275. At the time of transition 280 of clock signal 255, the values of the two sense amplifier outputs 270 and 275 are stored in two output data registers. Thus, the value 282 of sense amplifier output 270 is stored by a first data output register 285 and the value 284 of sense amplifier 275 is stored by second data output register 287. Once the data output registers 285 and 287 have stored the two data values retrieved from the memory array, the value 289 of the first data output register 285 is provided to the data output 292 in the first half of a clock cycle. At the time of transition 295, which marks the beginning of the second half of a clock cycle, the value 291 of the second data output register 287 is provided to the data output 292.

Figure 3:
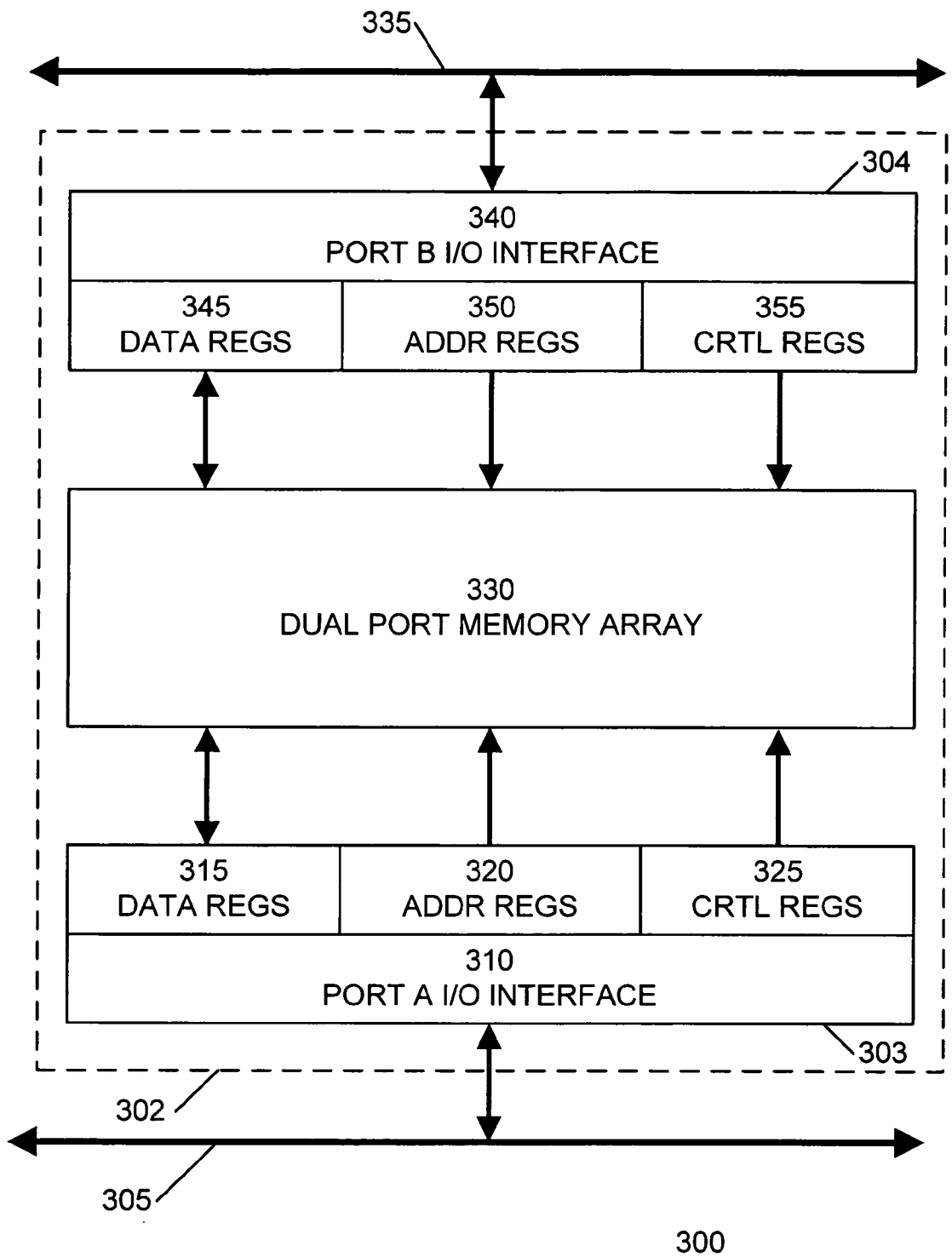
FIG. 3 illustrates an interface between a memory block and other portions of a programmable device according to an embodiment of the invention.

FIG. 3 illustrates an interface 300 between a memory block 302 and other portions of a programmable device according to an embodiment of the invention. In an embodiment, the memory block 302 includes two access ports, port A 303 and port B 304. Each access port is capable of reading or writing data to the memory array 330 independently of the operations of the other ports. In a further embodiment, the data registers of the data input and data output circuits within an access port are shared, as an embodiment of an access port cannot read and write data simultaneously. Other embodiments of the memory block 302 can have any number of access ports. Furthermore, embodiments of the memory block 302 can have one or more access ports restricted to either reading or writing operations only.

A first data bus 305 is connected with port A interface 310. Port A interface is adapted to receive and transmit data signals between the memory block 302 and other portions of the programmable device. The data bus 305 can include any number of data lines for communicating data bits in parallel between port A 303 of the memory block 302 and other portions of the programmable device. In further embodiments, data bus 305 also includes one or more signal lines for communicating memory addresses to port A 303 of the memory block 302. In still further embodiments, data bus 305 also includes signal lines for additional control signals typically used to control memory accesses. This can include signals specifying whether a read or write operation is to be performed using port A 303. In programmable device configurations where the data rate communication scheme of port A 303 of the memory block is specified by control logic of the programmable device, rather than the configuration data, data bus 305 can include a signal line used to specify the data rate communication scheme used by port A 303 of memory block 302.

Port A interface 310 is connected with data registers 315, address registers 320, and control registers 325. Data registers 315 store data to be written to the memory array 330 and data retrieved from the memory array 330. Address registers 320 store the memory address used to specify the memory location or locations in which data is to be stored or retrieved via port A 303.

The data registers 315, address registers 320, and control registers 325 are interfaced with the memory array 330. In an embodiment, the data registers 315 are incorporated in data input and output circuits 100 and 150 described above, which in turn are interfaced with the memory array 330. The address registers 320 and control registers 325 are connected with the memory array 330 in a manner well known to one of ordinary skill in the art.

Similarly, a second data bus 335 is connected with port B interface 340. Port B interface 340 is adapted to receive and transmit data signals between the memory block 302 and other portions of the programmable device. The data bus 335 can include any number of data lines for communicating data bits in parallel between port B 304 of the memory block 302 and other portions of the programmable device. In further embodiments, data bus 335 also includes one or more signal lines for communicating memory addresses to port B 304 of the memory block 302. In still further embodiments, data bus 305 also includes signal lines for additional control signals typically used to control memory accesses. This can include signals specifying whether a read or write operation is to be performed using port B 304. In programmable device configurations where the data rate communication scheme of port B 304 of the memory block is specified by control logic of the programmable device, rather than the configuration data, data bus 335 can include a signal line used to specify the data rate communication scheme used by port B 304 of memory block 302.

Port B interface 340 is connected with data registers 345, address registers 350, and control registers 355. Data registers 345 store data to be written to the memory array 330 and data retrieved from the memory array 330. Address registers 350 store the memory address used to specify the memory location or locations in which data is to be stored or retrieved via port B 304.

The data registers 345, address registers 350, and control registers 355 are interfaced with the memory array 330. In an embodiment, the data registers 345 are incorporated in data input and output circuits 100 and 150 described above, which in turn are interfaced with the memory array 330. The address registers 350 and control registers 355 are connected with the memory array 330 in a manner well known to one of ordinary skill in the art.

In embodiments of the invention, logic cells or other functional blocks of the programmable device can communicate with a memory block using single or double data rate communication schemes. In typical programmable device configurations, a group of logic cells or a functional block will only need to use one of these communication schemes to communicate with a memory block. However, as discussed above, a given memory block may need to employ both communications schemes to communicate with different portions of the programmable device. For example, a set of logic cells may require double data rate communications with a memory block, while a functional block may require only single data rate communications with the same memory block.

In embodiments of the invention, logic cells and functional blocks that communicate with a memory block using a single data rate communication scheme do not require any additional interface logic. If the memory block alternates between single and double data rate communications schemes according to control logic, then an embodiment of this control logic should configure the memory block appropriately when these logic cells or functional blocks are communicating with the memory block.

Figure 4A:
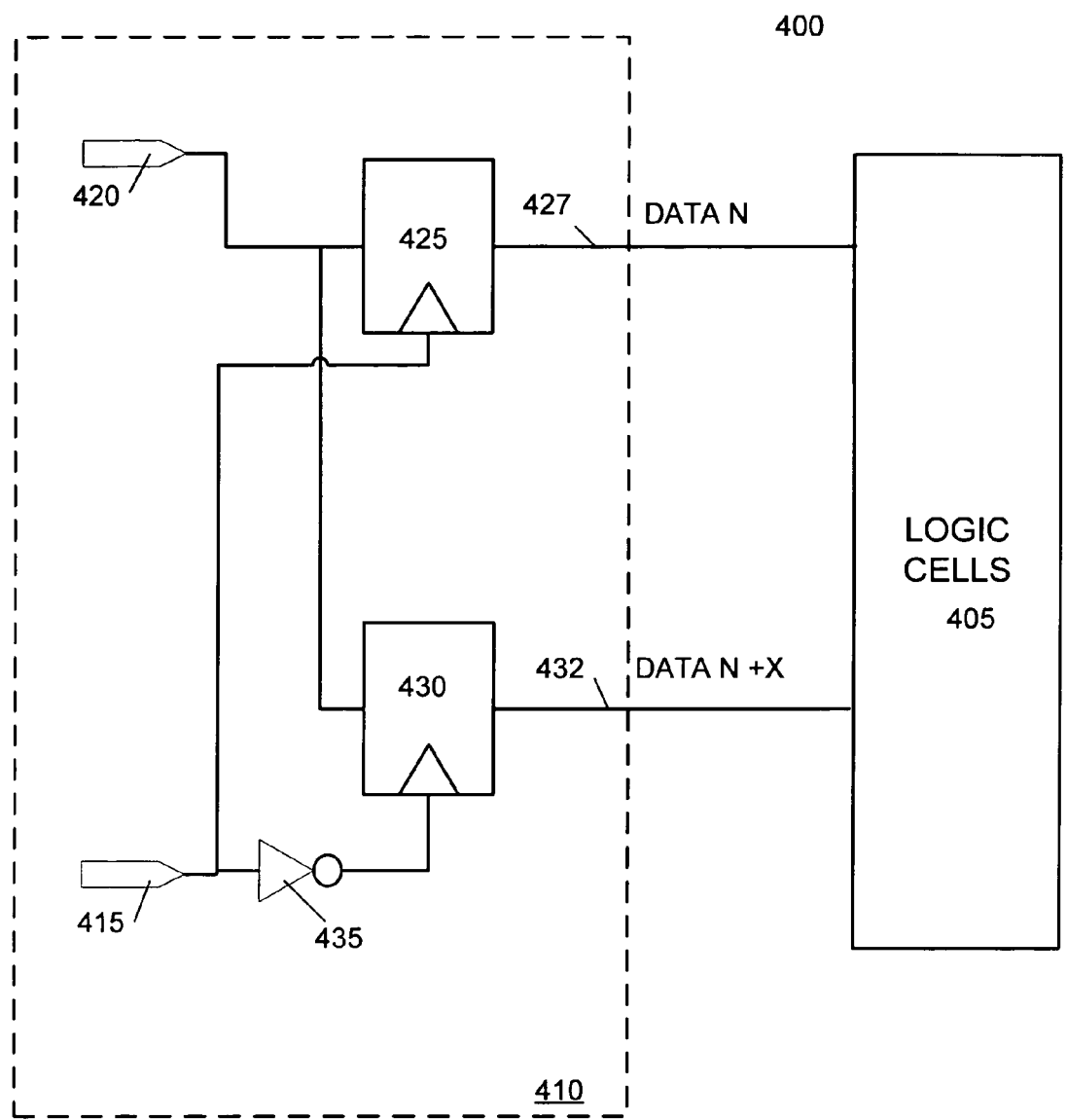
FIGS. 4A-4B illustrate double data rate input and output interfaces for logic cells and functional blocks of a programmable device according to an embodiment of the invention.
Figure 4B:
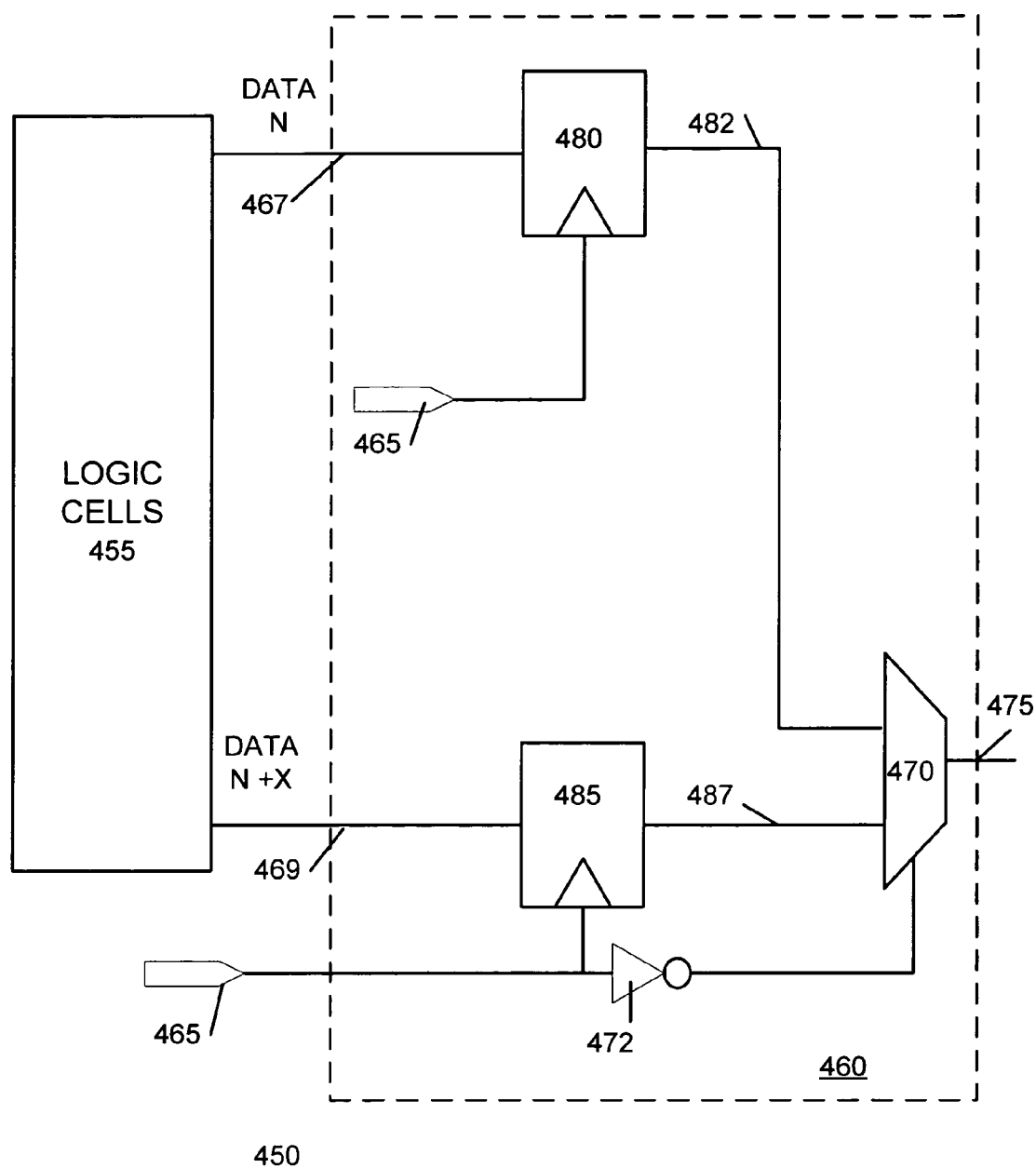

In a further embodiment, additional interface logic is required to interface logic cells or functional blocks with a memory block using a double data rate communication scheme. FIGS. 4A-4B illustrate double data rate input and output interfaces for logic cells and functional blocks of a programmable device according to an embodiment of the invention. In an embodiment, the input and output interfaces for logic cells and functional blocks can be implemented using additional logic cells. This has the advantage of allowing any group of logic cells or functional blocks to use a double data rate communication scheme with minimal additional overhead. In other embodiments, logic cells or function blocks can implement the input and output interfaces using additional dedicated logic circuits.

FIG. 4A illustrates a configuration 400 of a data input interface for logic cells or functional blocks according to an embodiment of the invention. A set of one or more logic cells or a functional block 405 is connected with data input interface 410. The data input interface 410 is adapted to receive two bits of data per clock cycle per data signal line. Typically, the set of logic cells or functional block 405 can only operate at the normal clock rate, rather than twice the clock rate. As a result, the data input interface 410 outputs two bits of data in parallel per clock cycle per data signal line. Thus, the set of logic cells or functional block 405 should be adapted to receive two data bits in parallel per clock cycle per data signal line from the data input interface 410.

Data input interface 410 is connected with a data signal line 420 adapted to receive data using a double data rate communication scheme. Data signal line 420 is connected with the data inputs of data registers 425 and 430. Data registers 425 and 430 are connected with a clock signal input 415. Clock signal input 415 is connected with the clock input of data register 425. The data register 425 responds to the clock signal provided via the clock signal input 415 by storing the value of the data signal, provided via data signal input 420, during the first half of a clock cycle.

Clock signal input 415 is connected with the clock input of data register 430 via inverter gate 435. The data register 430 responds to the clock signal provided via the clock signal input 415 by storing the value of the data signal, provided via data signal input 420, during the second half of a clock cycle.

The set of logic cells or functional block 405 can then read the two bits of data provided in each clock cycle via data register outputs 427 and 432.

FIG. 4B illustrates a configuration 450 of a data output interface for logic cells or functional blocks according to an embodiment of the invention. A set of one or more logic cells or a functional block 455 is connected with data output interface 460. The data output interface 460 is adapted to receive two bits of data per clock cycle from the set of logic cells or functional block 455 via data inputs 467 and 469.

Data inputs 467 and 469 are connected with the data inputs of data registers 480 and 485, respectively. Clock signal input 465 is connected with the clock inputs of data registers 480 and 485. Data registers 480 and 485 respond to the clock signal provided by clock signal input 465 by storing the data values received from the set of logic cells or functional block 455 via the data inputs 467 and 469.

The outputs 482 and 487 of data registers 480 and 485 are connected with multiplexer 470. The clock signal input 465 is connected with the control input of multiplexer 470 through inverter gate 472. In response to the clock signal received via the clock signal input 465, multiplexer 470 connects the output 482 of data register 480 with data output 475 during one half of a clock cycle. During the other half of the clock cycle, multiplexer 470 connects the output 487 of data register 485 with data output 475. Thus, data output interface 460 converts the two bits received in parallel from the set of logic cells or functional blocks 455 to an output signal communicating two bits of data per clock cycle per data line.

Figure 5:
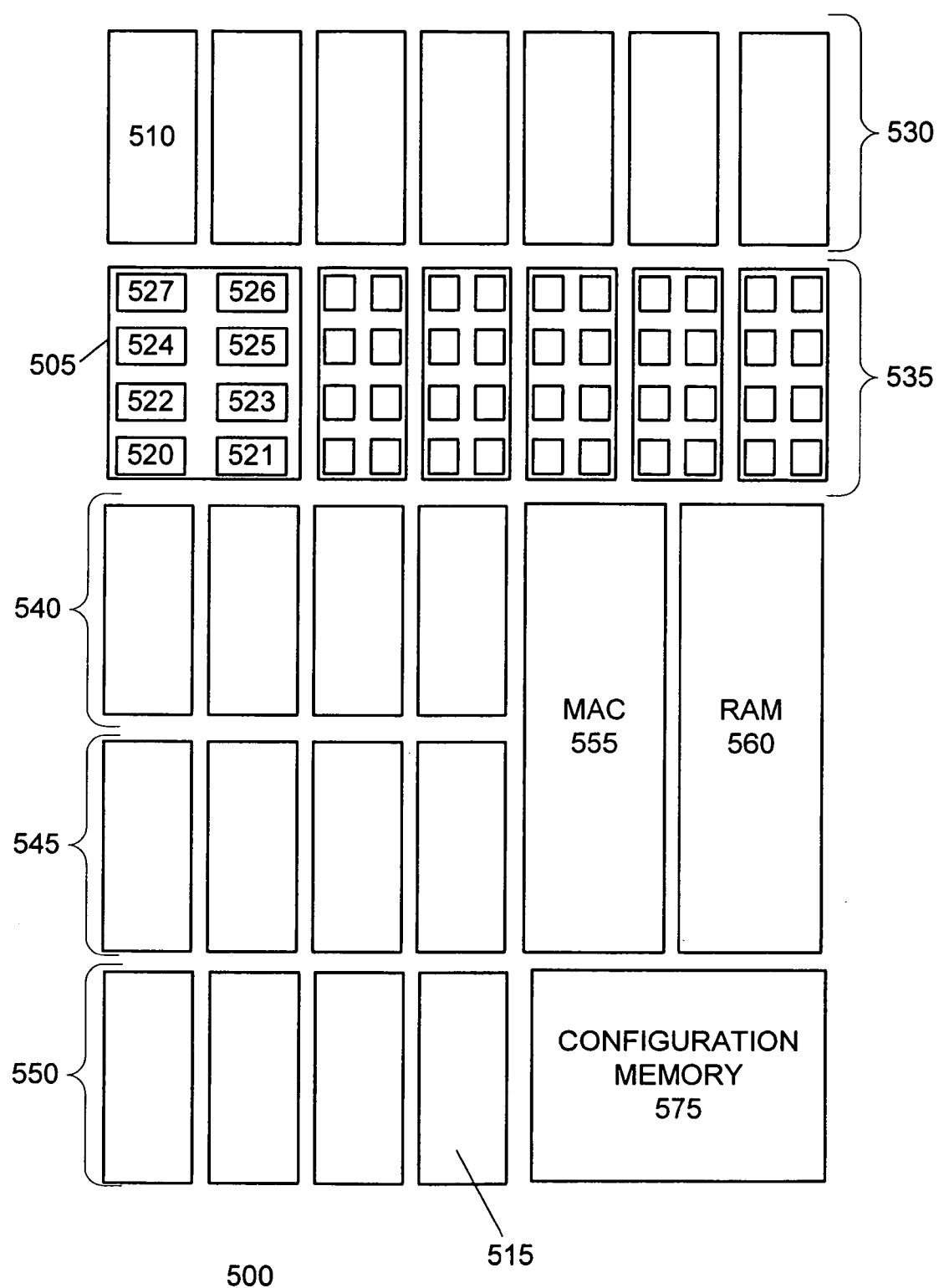
FIG. 5 illustrates a programmable device according to an embodiment of the invention.

FIG. 5 illustrates a programmable device according to an embodiment of the invention. Programmable device 500 includes a number of logic array blocks (LABs), such as LABs 505, 510, 515. Each LAB includes a number of programmable logic cells using logic gates and/or look-up tables to perform a logic operation. LAB 505 illustrates in detail logic cells 520, 521, 522, 523, 524, 525, 526, and 527. Logic cells are omitted from other LABs in FIG. 5 for clarity. The LABs of device 500 are arranged into rows 530, 535, 540, 545, and 550. In an embodiment, the arrangement of logic cells within a LAB and of LABs within rows provides a hierarchical system of configurable connections of a programmable switching circuit, in which connections between logic cells within a LAB, between cells in different LABs in the same row, and between cell in LABs in different rows require progressively more resources and operate less efficiently.

In addition to logic cells arranged in LABs, programmable device 500 also include specialized functional blocks, such as multiply and accumulate block (MAC) 555 and random access memory block (RAM) 560. The configuration of the programmable device is specified at least in part by configuration data stored in configuration memory 575. The configuration data can include parameters specifying data rate communication schemes to be used with one or more memory blocks of the programmable device 500, such as memory block 560, as well as the configuration of the programmable switching circuit. Additional configuration data can be stored in other parts of the programmable device. For example, the configuration data can include look-up table data to be stored in look-up table hardware in a logic cell. The look-up table data specifies a function to be implemented by the look-up table hardware. For clarity, the portion of the programmable device 500 shown in FIG. 5 only includes a small number of logic cells, LABs, and functional blocks. Typical programmable devices will include thousands or tens of thousands of these elements.

Further embodiments can be envisioned to one of ordinary skill in the art after reading the attached documents. For example, although the invention has been discussed with reference to programmable devices, it is equally applicable to any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A memory block in a device, the memory block comprising:
    a memory array adapted to store data; and
    a data output circuit having first and second modes to communicate data from the memory array to different portions of the device, the data output circuit including first and second data registers and a data output line,
        wherein the data output circuit is adapted to read a bit from the memory array at a first clock rate and to communicate the bit at the first clock rate via the data output line in the first mode,
        wherein the data output circuit is adapted to read first and second bits in parallel from the memory array at the first clock rate and to communicate the first and second bits at twice the first clock rate via the data output line in the second mode, and
        wherein the data output circuit is adapted to communicate with a first portion of the device at the first clock rate and to communicate with a second portion of the device at twice the first clock rate.

2. The memory block of claim 1, wherein the data output circuit is responsive to a mode selection input adapted to receive a mode selection signal from at least one portion of the device, wherein the mode selection signal specifies the first or second mode of the data output circuit of the memory block.

3. The memory block of claim 2, wherein the mode selection input is adapted to receive the mode selection signal from configuration data stored in a configuration memory of the device.

4. The memory block of claim 1, wherein the data output circuit is adapted to store the bit read in the first mode in the first data register and to store the first and second bits read in the second mode in the first and second data registers.

5. The memory block of claim 1, further comprising:
    a data input circuit having first and second modes, the data input circuit including a data input line, wherein the data input circuit is adapted to receive a bit from a third portion of the device via the data input line at a first clock rate and to store the bit in the memory array in the first mode, and wherein the data input circuit is adapted to receive first and second bits in series from a fourth portion of the device via the data input line at twice the first clock rate and to store the first and second bits in the memory array in the second mode.

6. The memory block of claim 5, wherein the data input circuit is adapted to store the first and second bits in parallel in the memory array in the second mode.

7. The memory block of claim 5, wherein the data input circuit is responsive to a mode selection input adapted to receive a mode selection signal from at least one portion of the device, wherein the mode selection signal specifies the first or second mode of the data input circuit of the memory block.

8. The memory block of claim 7, wherein the mode selection input is adapted to receive the mode selection signal from configuration data stored in a configuration memory of the device.

9. The memory block of claim 5, wherein the data input circuit is adapted to store the bit received in the first mode in the first data register and to store the first and second bits received in the second mode in the first and second data registers.

10. A programmable device comprising:
    a programmable logic circuit adapted to implement logic functions specified by configuration data;
    a memory block adapted to hold data used by the programmable logic circuit;
    a configuration memory adapted to store at least a portion of the configuration data; and
    a programmable switching circuit providing a set of configurable connections within the programmable logic circuit and with the memory block and the configuration memory;
    wherein the memory block comprises:
    a memory array adapted to store data, the memory array having a first port and a second port the first port coupled to a first data output circuit and the second port coupled to a second data output circuit; and
    each data output circuit having first and second modes, the data output circuit including first and second data registers and a data output line,
        wherein each data output circuit is adapted to read a bit from the memory array at a first clock rate and to communicate the bit at the first clock rate via the data output line in the first mode,
        wherein each data output circuit is adapted to read first and second bits in parallel from the memory array at the first clock rate and to communicate the first and second bits at twice the first clock rate via the data output line in the second mode, and
        wherein the first port is adapted to communicate with a first portion of the programmable device at the first clock rate via the first data output circuit, and the second port is adapted to simultaneously communicate with a second portion of the programmable device at twice the first clock rate via the second data output circuit.

11. The programmable device of claim 10, wherein the first data output circuit is responsive to a mode selection input adapted to receive a mode selection signal from at least one portion of the programmable device, wherein the mode selection signal specifies the first or second mode of the first data output circuit of the memory block.

12. The programmable device of claim 11, wherein the mode selection input is adapted to receive the mode selection signal from configuration data stored in the configuration memory of the programmable device.

13. The programmable device of claim 10, wherein the first data output circuit is adapted to store the bit read in the first mode in the first data register and to store the first and second bits read in the second mode in the first and second data registers, and wherein the first data output circuit includes a multiplexer circuit connected with the first and second data registers, wherein the multiplexer circuit is adapted to connect the first data register with the data output line in the first mode, and, in the second mode, to connect the first data register to the data output line for a first portion of a clock cycle and the second data register to the data output line for a second portion of the clock cycle.

14. The programmable device of claim 10, wherein the memory block further comprises:
a data input circuit having first and second modes, the data input circuit including a data input line, wherein the data input circuit is adapted to receive a bit from another portion of the programmable device via the data input line at a first clock rate and to store the bit in the memory array in the first mode, and wherein the data input circuit is adapted to receive first and second bits in series from another portion of the programmable device via the data input line at twice the first clock rate and to store the first and second bits in the memory array in the second mode.

15. The programmable device of claim 14, wherein the data input circuit is responsive to a mode selection input adapted to receive a mode selection signal from at least one portion of the programmable device, wherein the mode selection signal specifies the first or second mode of the data input circuit of the memory block.

16. The programmable device of claim 15, wherein the mode selection input is adapted to receive the mode selection signal from configuration data stored in the configuration memory of the programmable device.

17. The programmable device of claim 15, wherein the mode selection input is adapted to receive a first mode selection signal from the second portion of the programmable device adapted to communicate data with the memory block at twice the first clock rate via the data input line.

18. The programmable device of claim 17, wherein the second portion of the programmable device includes portions of the programmable logic circuit and the programmable switching circuit configured according to the configuration data to communicate data with the memory block at twice the first clock rate via the data output line.

19. The programmable device of claim 17, wherein the second portion of the programmable device includes a circuit having a fixed configuration.

* * * * *

UNITED STATES PATENT AND TRADEMARK OFFICE
CERTIFICATE OF CORRECTION

PATENT NO. : 7,460,431 B1 Page 1 of 1
APPLICATION NO. : 11/242693
DATED : December 2, 2008
INVENTOR(S) : Pan et al.

It is certified that error appears in the above-identified patent and that said Letters Patent is hereby corrected as shown below:

IN THE CLAIMS:

In Claim 10, column 14, line 28, please insert -- , -- between the words "port" and "the".

Signed and Sealed this

Seventh Day of September, 2010

David J. Kappos
*Director of the United States Patent and Trademark Office*